(12) United States Patent
Kobayashi et al.

(10) Patent No.: US 7,084,803 B2
(45) Date of Patent: Aug. 1, 2006

(54) ANALOG-DIGITAL CONVERSION METHOD AND ANALOG-DIGITAL CONVERTER (75) Inventors: Shigeto Kobayashi, Gifu (JP); Kuniyuki Tani, Ogaki (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/047,706

(22) Filed: Feb. 2, 2005

(65) Prior Publication Data

US 2005/0168369 A1 Aug. 4, 2005

(30) Foreign Application Priority Data

Feb. 3, 2004 (JP) ............................. 2004-027406

(51) Int. Cl.
*H03M 1/16* (2006.01)
*H03M 1/44* (2006.01)
(52) U.S. Cl. ..................... 341/162; 341/163; 341/156
(58) Field of Classification Search ................ 341/156, 341/157, 161, 162, 163
See application file for complete search history.

(56) References Cited

U.S. PATENT DOCUMENTS

| 6,195,032 | B1 * | 2/2001 | Watson et al. | ............... 341/162 |
| 6,879,277 | B1 * | 4/2005 | Cai | ............................ 341/155 |
| 2004/0070530 | A1 * | 4/2004 | You | ............................ 341/163 |

FOREIGN PATENT DOCUMENTS

JP 04-026229 1/1992

* cited by examiner

*Primary Examiner*—Howard L. Williams
(74) *Attorney, Agent, or Firm*—McDermott Will & Emery LLP (57) ABSTRACT

A first amplifier circuit amplifies an input signal by a factor of $\alpha$. A first AD converter circuit is configured at an LSB voltage of VA and converts an input analog signal into a digital value of arbitrary N1 bits. A first DA converter circuit converts the digital value output from the first AD converter circuit into an analog signal. A subtracter circuit subtracts an output of the first DA converter circuit from an output of the first subtracter circuit. A second amplifier circuit amplifies an output of the subtracter circuit by a factor of $\beta$. A second AD converter is configured at an LSB voltage of VB and converts an input analog signal into a digital value of arbitrary N2 bits. In this circuit, the relation $VA*\alpha*\beta=VB*2^{N2}$ holds.

20 Claims, 4 Drawing Sheets

ANALOG-DIGITAL CONVERSION METHOD AND ANALOG-DIGITAL CONVERTER

BACKGROUND OF THE INVENTION

1. Field of the Invention

The present invention generally relates to an analog-digital conversion method and an analog-digital converter and, more particularly, to an analog-digital conversion method and an analog-digital converter of a pipeline type and that of a cyclic type.

2. Description of the Related Art

In recent years, a variety of additional functions are built in mobile appliances such as a mobile telephone set, including the image pick-up function, the image playback function, the moving image pick-up function and the moving image playback function. In association with this, there is an increasing demand for miniaturization and power saving of an analog-digital converter (hereinafter, referred to as an AD converter). One mode of AD converter that addresses this demand is known as an AD converter of a cyclic type configured to go through discrete cycles (see, for example, the Related art list No. 1).

Related Art List
1. Japanese Patent Application Laid-open No. 4-26229

In the cyclic AD converter of FIG. 1 of the patent document No. 1, the parallel A/D converter AD2 is assigned the task of converting into 3 bits. Therefore, a high gain of 8 is required of the subtracter circuit SUB2 or the sample and hold circuit S/H4.

However, the performance of an amplifier circuit is limited by a factor known as gain bandwidth product (GB product). The higher the target gain, the lower the operating frequency of the amplifier and the slower the operation. Accordingly, the amplifier circuit constitutes a limiting factor in the speed of operation of the AD converter as a whole.

SUMMARY OF THE INVENTION

The present invention has been done in view of the aforementioned circumstances and its objective is to improve the speed of an AD converter of a pipeline type and that of a cyclic type.

The present invention according to one aspect provides an analog-digital conversion method. The analog-digital conversion method according to this aspect is an analog-digital conversion method which converts an analog signal into a digital value of a predetermined number of bits, in a plurality of sequential steps starting from higher bits, comprising: a first conversion step of comparing a predetermined reference voltage value with a reference voltage value generated by a first LSB voltage value and converting an analog signal into at least 1 bit; and a second conversion step of comparing a predetermined reference voltage value with a reference voltage value generated by a second LSB voltage value and converting an analog signal, having a bit component produced by conversion in the first conversion step removed therefrom and amplified by a predetermined gain, into at least 1 bit lower in the order than the bits produced by conversion in the first conversion step, wherein a value obtained by multiplying the first LSB voltage value by the predetermined gain is practically equal to a value obtained by multiplying the second LSB voltage value by a value obtained by raising 2 to the power of the number of bits produced by conversion in the second conversion step and having redundant bits excluded therefrom, and wherein the first LSB voltage value differs from the second LSB voltage value.

Arbitrary combinations of the aforementioned constituting elements, and implementations of the invention in the form of methods, apparatus and systems may also be practiced as additional modes of the present invention.

DETAILED DESCRIPTION OF THE INVENTION

A summary of the present invention will be given before giving a detailed description. The present invention according to one aspect provides an analog-digital conversion method. The analog-digital conversion method according to this aspect is an analog-digital conversion method which converts an analog signal into a digital value of a predetermined number of bits, in a plurality of sequential steps starting from higher bits, comprising: a first conversion step of comparing a predetermined reference voltage value with a reference voltage value generated by a first LSB voltage value and converting an analog signal into at least 1 bit; and a second conversion step of comparing a predetermined reference voltage value with a reference voltage value generated by a second LSB voltage value and converting an analog signal, having a bit component produced by conversion in the first conversion step removed therefrom and amplified by a predetermined gain, into at least 1 bit lower in the order than the bits produced by conversion in the first conversion step, wherein a value obtained by multiplying the first LSB voltage value by the predetermined gain is practically equal to a value obtained by multiplying the second LSB voltage value by a value obtained by raising 2 to the power of the number of bits produced by conversion in the second conversion step and having redundant bits excluded therefrom, and wherein the first LSB voltage value differs from the second LSB voltage value.

According to this aspect, the first LSB voltage value is different from the second LSB voltage value so that the gain of the first conversion step is controlled. By controlling the first LSB voltage to be lower than the second LSB voltage value, the gain is lowered and the operation speed is improved.

The present invention according to another aspect provides an analog-digital converter. The analog-digital converter according to this aspect comprises: a first AD converter circuit converting an input analog signal into a digital value of a predetermined number of bits; a DA converter circuit converting an output of the first AD converter circuit into an analog signal; a subtracter circuit subtracting an output of the DA converter circuit from the input analog signal; an amplifier circuit amplifying an output of the subtracting circuit by a predetermined gain; and a second AD converter circuit converting an output analog signal from the amplifier circuit into a digital value of a predetermined number of bits, wherein a value obtained by multiplying an LSB voltage value of the first AD converter circuit by the gain of the amplifier circuit is practically equal to a value obtained by multiplying an LSB voltage value of the second AD converter circuit by a value obtained by raising 2 to the power of the number of bits produced by conversion in the second AD converter circuit and having redundant bits excluded therefrom, and wherein the LSB voltage value of the first AD converter circuit differs from the LSB voltage value of the second AD converter circuit.

According to this aspect, the LSB voltage value of the first AD converter circuit is different from the LSB voltage value of the second AD converter circuit so that the gain of the amplifier circuit is controlled. By controlling the LSB voltage value of the first AD converter circuit to be lower than the LSB voltage value of the second AD converter circuit, the gain of the amplifier is lowered and the operation speed is improved.

The present invention according to still another aspect also provides an analog-digital converter. The analog-digital converter according to this aspect comprises: a first AD converter circuit converting an input analog signal into a digital value of a predetermined number of bits; a DA converter circuit converting an output of the first AD converter circuit into an analog signal; a first amplifier circuit provided parallel with the first AD converter circuit and amplifying the input analog signal by a predetermined gain; a subtracter circuit subtracting an output of the DA converter circuit amplified by practically the same gain as the gain of the first amplifier circuit from an output of the first amplifier circuit; a second amplifier circuit amplifying an output of the subtracting circuit by a predetermined gain; a second AD converter circuit converting an output analog signal from the second amplifier circuit into a digital value of a predetermined number of bits, wherein a value obtained by multiplying an LSB voltage value of the first AD converter circuit by the gain of the amplifier circuit and the gain of the second amplifier circuit is practically equal to a value obtained by multiplying an LSB voltage value of the second AD converter circuit by a value obtained by raising 2 to the power of the number of bits produced by conversion in the second AD converter circuit and having redundant bits excluded therefrom, and wherein the LSB voltage value of the first AD converter circuit differs from the LSB voltage value of the second AD converter circuit.

According this aspect, by arbitrarily setting parameters including the LSB voltage value of the first AD converter circuit, the gain of the first amplifier circuit, the gain of the second amplifier circuit, the LSB voltage value of the second AD converter circuit and the number of bits produced by conversion by the second AD converter circuit, the gain of the first amplifier circuit and the gain of the second amplifier circuit, which are bottlenecks on improvement in operation speed, can be easily controlled. The gain of the first amplifier circuit may be 1.

The LSB voltage value of the second AD converter circuit may be smaller than the LSB voltage value of the first AD converter circuit. With this, the product of the gain of the first amplifier circuit and the gain of the second amplifier circuit is lowered so that the operation speed of the first amplifier circuit and the second amplifier circuit is improved and the operation speed of the AD converter as a whole is improved.

The present invention according to yet another aspect also provides an analog-digital converter. The analog-digital converter according to this aspect comprises: an AD converter circuit converting an input analog signal into a digital value of a predetermined number of bits; a DA converter circuit converting an output of the AD converter circuit into an analog signal; a first amplifier circuit provided parallel with the AD converter circuit and amplifying the input analog signal by a predetermined gain; a subtracter circuit subtracting an output of the DA converter circuit amplified by practically the same gain as the gain of the first amplifier circuit from an output of the first amplifier circuit; a second amplifier circuit amplifying an output of the subtracting circuit by a predetermined gain and feeding the amplified output back to the input of the AD converter circuit; wherein a digital value in excess of the predetermined number of bits is obtained by allowing the input analog signal through a plurality of cycles such that a value obtained by multiplying an LSB voltage value of the AD converter circuit in a given cycle by the gain of the first amplifier circuit and the gain of the second amplifier circuit is practically equal to a value obtained by multiplying an LSB voltage value of the AD converter circuit in a subsequent cycle by a value obtained by raising 2 to the power of the number of bits produced by conversion in the AD converter circuit and having redundant bits excluded therefrom, and wherein the LSB voltage value of the AD converter circuit in the given cycle differs from the LSB voltage value of the AD converter circuit in the subsequent cycle.

According to this aspect, by arbitrarily setting parameters including the LSB voltage value of the AD converter circuit in the given cycle, the gain of the first amplifier circuit, the gain of the second amplifier circuit, the LSB voltage value of the AD converter circuit in the subsequent cycle and the number of bits produced by conversion by the AD converter circuit, the gain of the first amplifier circuit and the gain of the second amplifier circuit, which are bottlenecks on improvement in operation speed, can be easily controlled. The gain of the first amplifier circuit may be 1.

The LSB voltage value in the subsequent cycle may be smaller than the LSB voltage value of the given cycle. With this, the product of the gain of the first amplifier circuit and the gain of the second amplifier circuit is lowered so that the operation speed of the first amplifier circuit and the second amplifier circuit is improved and the operation speed of the AD converter as a whole is improved.

The gain of the first amplifier circuit and the gain of the second amplifier circuit may be related to each other such that one is equal to or more than ½ of the other and equal to or less than twice the other. With this, amplifier circuits with a high gain are eliminated so that the operation speed of AD converter as a whole is improved.

The gain of the first amplifier circuit may be smaller than the gain of the second amplifier circuit. With this, the characteristics are preserved even when an input analog signal is at a low voltage. More specifically, by decreasing the gain of the first amplifier circuit, the output therefrom is fitted in an output voltage range thereof.

Basic Structure

Figure 1:
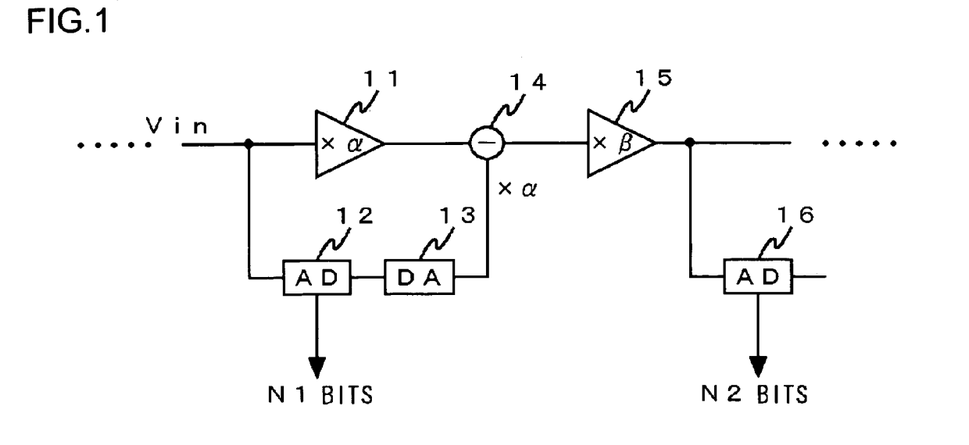
FIG. 1 illustrates the basic structure of the present invention.

FIG. 1 illustrates the basic structure of the present invention. FIG. 1 not only illustrates a pipeline type but also provides an illustration of a given cycle and a subsequent cycle in an AD converter circuit of a cyclic type. In the latter case, a first AD converter circuit 12 and a second AD converter circuit 16 are physically identical.

Referring to FIG. 1, an input analog signal Vin is fed to a first amplifier circuit 11 and the first AD converter circuit 12. The first AD converter circuit converts the input analog signal into a digital signal of N1 bits and outputs the digital signal to an encoder (not shown) and a first DA converter circuit 13. A plurality of voltage comparison elements are provided in the first AD converter circuit 12. The voltage comparison elements are supplied with reference voltages with a voltage step size VA[V] defined by the least significant bit (hereinafter, referred to as an LSB voltage) in the first AD converter circuit 12. The first DA converter circuit 13 converts the digital value output from the first AD converter circuit 12 into an analog signal.

The first amplifier circuit 11 samples the input analog signal and amplifies the same by a factor of $\alpha$. A subtracter circuit 14 subtracts the analog value output from the first DA converter circuit 13 from the analog value amplified and held by the first amplifier circuit 11. The output of the first DA converter circuit 13 is amplified by a factor of $\alpha$ in association with the gain $\alpha$ of the first amplifier circuit 11. A second amplifier circuit 15 amplifies the output of the subtracter circuit 14 by a factor of $\beta$. The output of the second amplifier circuit 15 is fed to the second AD converter circuit 16. The output of the second amplifier circuit 15 is also fed to a circuit of a subsequent stage or a feedback circuit (not shown).

The second AD converter circuit 16 converts the input analog signal to a digital signal of N2 bits and outputs the digital signal to an encoder (not shown) and a DA converter circuit (not shown) The N2 bits do not include redundant bits. Throughout the specification, it is assumed that the N2 bits do not include redundant bits. A plurality of voltage comparison elements are provided in the second AD converter circuit 16. The voltage comparison elements are supplied with reference voltages with a step size of VB[V], which is an LSB voltage VB[V] of the second AD converter circuit 16.

The signal fed to the second AD converter circuit 16 is given as VA*$\alpha$*$\beta$. Since the second AD converter circuit 16 outputs a digital value of N2 bits, the range in which the second AD converter circuit 16 receives a signal is defined by VB*$2^{N2}$. Accordingly, the signal can be successfully delivered if the following equation (A1) holds.

$$VA*\alpha*\beta = VB*2^{N2} \quad (A1)$$

According to the present invention, parameters are modified relatively freely so that the equation (A1) holds. In this way, the gain $\alpha$ and the gain $\beta$ can be lowered. The gain of the first amplifier circuit 11 may be 1. In other words, the equation A1 also holds in a configuration in which a sample and hold circuit is provided in parallel with the first AD converter circuit 12.

In the above description, two-step amplification using the first amplifier circuit 11 and the second amplifier circuit 15 was described. The equation A1 also holds in a configuration in which the first amplifier circuit 11 and the sample and hold circuit are not provided, and in which the input analog signal Vin is directly input to the second amplifier circuit 15 via the subtracter circuit 14. In this case, $\alpha$ can be regarded as 1.

First Embodiment

The first embodiment provides an AD converter in which the AD converter circuit in the first stage converts into 4 bits and the AD converter circuit of a cyclic type in the subsequent stage converts into 3 bits in each cycle. By allowing the conversion in the subsequent stage to go through 3 cycles, a total of 13 bits are output.

Figure 2:
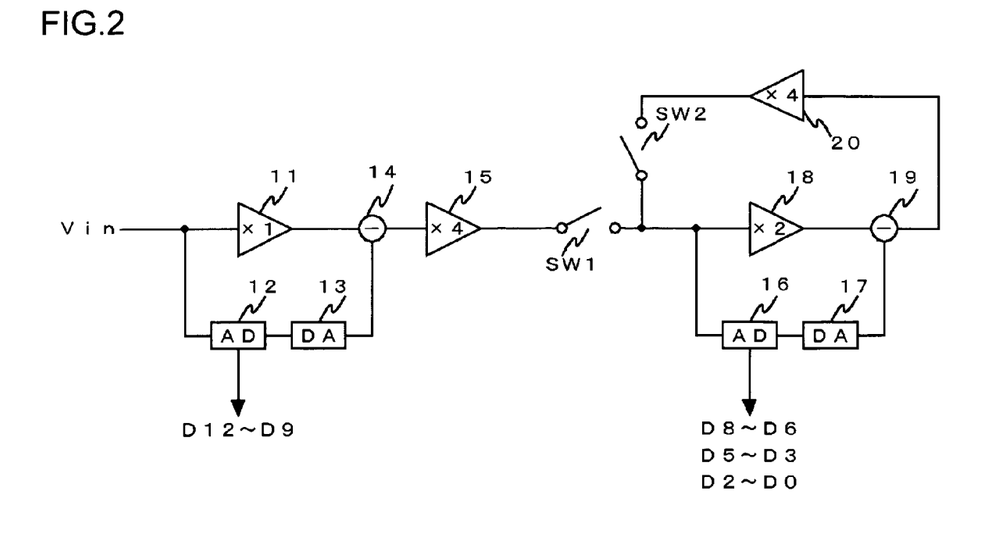
FIG. 2 illustrates the structure of an AD converter according to a first embodiment of the present invention.

FIG. 2 illustrates the structure of the AD converter according to the first embodiment. In this AD converter, the input analog signal Vin is fed to the first amplifier circuit 11 and the first AD converter circuit 12. The first AD converter circuit 12 converts the input analog signal into a digital value so as to retrieve the higher 4 bits (D12–D9). The first DA converter circuit 13 converts the digital value produced by conversion by the first AD converter circuit 12 into an analog value. The first amplifier circuit 11 samples and holds the input analog signal and outputs the signal to the first subtracter circuit 14 according to a predetermine schedule. The first amplifier circuit 11 does not amplify the analog signal. The first subtracter circuit 14 subtracts the output of the first DA converter circuit 13 from the output of the first amplifier circuit 11. The second amplifier circuit 15 amplifies the output of the first subtracter circuit 14 by a factor of 4.

The analog signal input via a first switch SW1 is fed to a third amplifier circuit 18 and a second AD converter circuit 16. The second AD converter circuit 16 converts the input analog signal into a digital value and retrieves the 5th through 7th highest bits (D8–D6). The second AD converter circuit 17 converts the digital value produced by conversion by the second AD converter circuit 16 into an analog value.

The third amplifier circuit 18 amplifies the input analog signal by a factor of 2 and outputs the amplified signal to a second subtracter circuit 19. The second subtracter circuit 19 subtracts the output of the second DA converter circuit 17 from the output of the third amplifier circuit 18. The output of the second DA converter circuit 17 is amplified by a factor of 2.

A description will be given of a method of amplifying the output of the second DA converter 17 by a factor of 2. A higher reference voltage VRT and a lower reference voltage VRB are supplied to the second AD converter 16 and the second DA converter circuit 17. The second AD converter circuit 16 uses a reference voltage range generated by the higher reference voltage VRT and the lower reference voltage VRB to generate a reference voltage. The second DA converter circuit 17 obtains an output voltage by selectively supplying the higher reference voltage VRT and the lower reference voltage VRB to each of capacitors (not shown), under the control of the second AD converter circuit 16. For amplification by a factor of 2, the reference voltage range of the second AD converter circuit 16 and the reference voltage range (VRT–VRB) of the second DA converter circuit 17 may be set to a ratio of 1:2.

A fourth amplifier circuit 20 amplifies the output of the second subtracter circuit 19 by a factor of 4. The amplified analog signal is fed back to the third amplifier circuit 18 and the second AD converter circuit 16 via a second switch SW2. A subtracting amplifier circuit, which is an amplifier circuit provided with the subtracting function, may be used instead of the second subtracter circuit 19 and the fourth amplifier circuit 20. With this, the circuit is simplified. The process described above is repeated so that the second AD converter circuit 16 retrieves the 8th through 10th highest bits (D5–D3) and the 11th through 13th highest bits (D2–D0). With this, a 13-bit digital value is obtained. The 5th through 13th highest bits (D8–D0) are obtained by a cyclic configuration.

Given, in the AD converter described above, that the LSB voltage of the first AD converter circuit 12 is VA, the gain of the first amplifier circuit 11 is $\alpha$, the gain of the second amplifier circuit 15 is $\beta$, the LSB voltage of the second AD converter circuit 16 is VB, and the number of bits produced by the second AD converter circuit 16 by conversion is N2, the equation (A1) into which these values are substituted would be:

$$VA*\alpha*\beta = VB*2^{N2}$$

$$VA*1*4 = VB*2^3$$

$$VA = 2VB$$

This shows that the LSB voltage of the first AD converter circuit 12 should be set to a value twice the LSB voltage of the second AD converter circuit 16. Conversely, by setting the LSB voltage of the second AD converter circuit 16 to ½, the gain of the second amplifier circuit 15 can be lowered from 8 to 4. For conversion into 3 bits in the subsequent stage according to the related art, the product of the gains of the first amplifier 11 and the second amplifier circuit 15 in the first stage should be 8. Accordingly, the gain of the first amplifier circuit 11 is set to 1 and the gain of the second amplifier circuit 15 is set to 8. It will be appreciated that, according to the first embodiment, by maintaining the gain of the first amplifier circuit 11 at 1, an amplifier of a relative narrow voltage range may be used as the first amplifier circuit 11. By allowing the gain of the second amplifier circuit 15 to be set to 4, the operation speed of the second amplifier circuit 15 is improved.

Given that the LSB voltage of the second AD converter circuit 16 in a given cycle is VA, the LSB voltage of the second AD converter circuit 16 in the subsequent cycle is VB, the gain of the third amplifier circuit 18 is α, the gain of the fourth amplifier circuit 20 is β, and the number of bits produced by conversion by the second AD converter circuit 16 is N2, the equation (A1) into which these values are substituted is as follows, since the LSB voltage of the second AD converter circuit 16 of this embodiment is fixed, i.e. VA=VB.

$$VA*\alpha*\beta = VB*2^{N2}$$

$$VA*2*4 = VB*2^3$$

This shows that the equation (A1) holds. The requirement here is that the product of the gain α of the third amplifier circuit 18 and the gain β of the fourth amplifier circuit 20 in the left side of the equation is 8. Combinations of the gains other than that described also serve the purpose. For example, a combination of 2.5 and 3.2 is possible.

Thus, according to the first embodiment, by lowering the gain of the second amplifier 15 and the gain of the fourth amplifier circuit 20, the operation speed thereof is improved so that the operation speed of the AD converter as a whole is improved.

Second Embodiment

The second embodiment provides an AD converter in which the AD converter circuit in the first stage converts into 4 bits and the AD converter circuit of a cyclic type in the subsequent stage converts into 2 bits in each cycle. By allowing the conversion in the subsequent stage to go through 3 cycles, a total of 10 bits are output.

Figure 3:
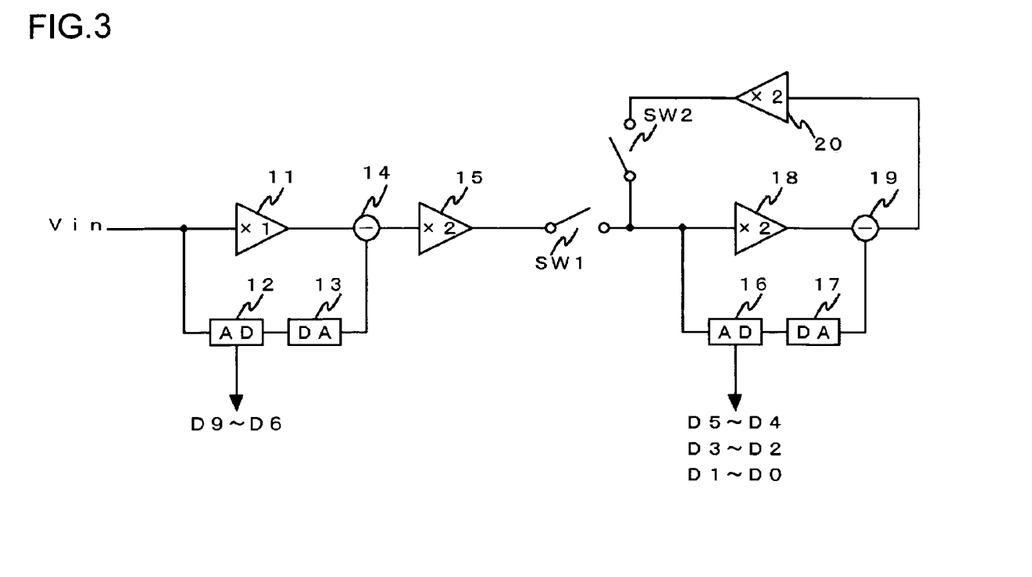
FIG. 3 illustrates the structure of an AD converter according to a second embodiment of the present invention.

FIG. 3 illustrates the structure of the AD converter according to the second embodiment. In this AD converter, the input analog signal Vin is fed to the first amplifier circuit 11 and the first AD converter circuit 12. The first AD converter circuit 12 converts the input analog signal into a digital value so as to retrieve the higher 4 bits (D9–D6). The first DA converter circuit 13 converts the digital value produced by conversion by the first AD converter circuit 12 into an analog value. The first amplifier circuit 11 samples and holds the input analog signal and outputs the signal to the first subtracter circuit 14 according to a predetermined timing schedule. The first amplifier circuit 11 does not amplify the analog signal. The first subtracter circuit 14 subtracts the output of the first DA converter circuit 13 from the output of the first amplifier circuit 11. The second amplifier circuit 15 amplifies the output of the first subtracter circuit 14 by a factor of 2.

The analog signal input via the first switch SW1 is fed to the third amplifier circuit 18 and the second AD converter circuit 16. The second AD converter circuit 16 converts the input analog signal into a digital value and retrieves the 4th through 5th highest bits (D5–D4). The second AD converter circuit 17 converts the digital value produced by conversion by the second AD converter circuit 16 into an analog value.

The third amplifier circuit 18 amplifies the input analog signal by a factor of 2 and outputs the amplified signal to the second subtracter circuit 19. The second subtracter circuit 19 subtracts the output of the second DA converter circuit 17 from the output of the third amplifier circuit 18. The output of the second DA converter circuit 17 is amplified by a factor of 2. The fourth amplifier circuit 20 amplifies the output of the second subtracter circuit 19 by a factor of 2. The amplified analog signal is fed back to the third amplifier circuit 18 and the second AD converter circuit 16 via the second switch SW2. The process described above is repeated so that the second AD converter circuit 16 retrieves the 7th through 8th highest bits (D3–D2) and the 9th through 10th highest bits (D1–D0). With this, a 10-bit digital value is obtained. The 5th through 10th highest bits (D5–D0) are obtained by a cyclic configuration.

Given, in the AD converter described above, that the LSB voltage of the first AD converter circuit 12 is VA, the gain of the first amplifier circuit 11 is α, the gain of the second amplifier circuit 15 is β, the LSB voltage of the second AD converter circuit 16 is VB, and the number of bits produced by the second AD converter circuit 16 by conversion is N2, the equation (A1) into which these values are substituted would be:

$$VA*\alpha*\beta = VB*2^{N2}$$

$$VA*1*2 = VB*2^2$$

$$VA = 2VB$$

This shows that the LSB voltage of the first AD converter circuit 12 should be set to a value twice the LSB voltage of the second AD converter circuit 16. Conversely, by setting the LSB voltage of the second AD converter circuit 16 to ½, the gain of the second amplifier circuit 15 can be lowered from 8 to 4.

Given that the LSB voltage of the second AD converter circuit 16 in a given cycle is VA, the LSB voltage of the second AD converter circuit 16 in the subsequent cycle is VB, the gain of the third amplifier circuit 18 is α, the gain of the fourth amplifier circuit 20 is β, and the number of bits produced by conversion by the second AD converter circuit 16 is N2, the equation (A1) into which these values are substituted is as follows, since the LSB voltage of the second AD converter circuit 16 of this embodiment is fixed, i.e. VA=VB.

$$VA*2*2 = VB*2^2$$

This shows that the equation (A1) holds. The requirement here is that the product of the gain α of the third amplifier circuit 18 and the gain β of the fourth amplifier circuit 20 in the left side of the equation is 4. Combinations of the gains other than that described also serve the purpose. For example, a combination of 1.6 and 2.5 is possible.

As demonstrated in the second embodiment, the AD converter in which the first stage converts into 3 bits and the subsequent stage cyclically converts into 2 bits is designed.

Third Embodiment

The third embodiment provides an AD converter in which the AD converter circuit of a cyclic type in the first stage converts into 3 bits in the first cycle and converts into 2 bits in the second cycle, and the AD converter circuit of a cyclic type in the subsequent stage converts into 2 bits in each of 3 cycles, outputting a total of 11 bits.

Figure 4:
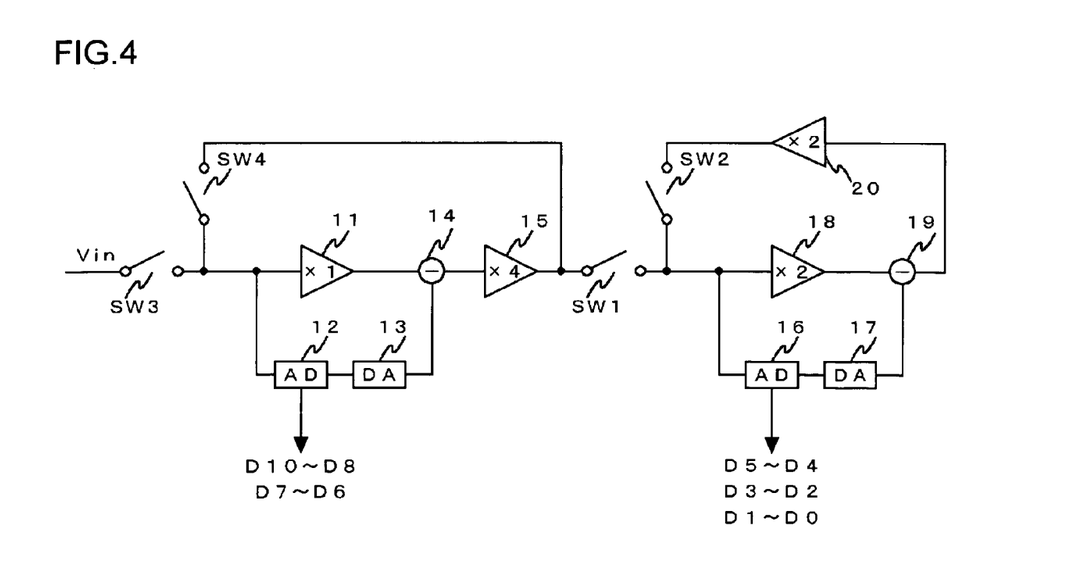
FIG. 4 illustrates the structure of an AD converter according to a third embodiment of the present invention.

FIG. 4 illustrates the structure of the AD converter according to the third embodiment. In this AD converter, the input analog signal Vin is fed to the first amplifier circuit 11 and the first AD converter circuit 12 via a third switch SW3. The first AD converter circuit 12 converts the input analog signal into a digital value so as to retrieve the higher 3 bits (D10–D8) The first DA converter circuit 13 converts the digital value produced by conversion by the first AD converter circuit 12 into an analog value. The first amplifier circuit 11 samples and holds the input analog signal and outputs the signal to the first subtracter circuit 14 according to a predetermine timing schedule. The first amplifier circuit 11 does not amplify the analog signal. The first subtracter circuit 14 subtracts the output of the first DA converter circuit 13 from the output of the first amplifier circuit 11. The second amplifier circuit 15 amplifies the output of the first subtracter circuit 14 by a factor of 2.

At this stage, a fourth switch SW4 is turned on and the third switch SW3 is turned off. The output of the second amplifier circuit 15 is fed again to the first amplifier circuit 11 and the first AD converter circuit 12 via the fourth switch SW4. The first AD converter circuit 12 converts the input analog signal into a digital value and retrieves the 4th through 5th highest bits (D7–D6).

The output of the second amplifier circuit 15 is fed to the first amplifier circuit 11 and the first AD converter circuit 12 and also to the third amplifier circuit 18 and the second AD converter circuit 16 via the first switch SW1. The second AD converter circuit 16 converts the input analog signal into a digital value and retrieves the 6th through 7th highest bits (D5–D4). The second AD converter circuit 17 converts the digital value produced by conversion by the second AD converter circuit 16 into an analog value.

The third amplifier circuit 18 amplifies the input analog signal by a factor of 2 and outputs the amplified signal to the second subtracter circuit 19. The second subtracter circuit 19 subtracts the output of the second DA converter circuit 17 from the output of the third amplifier circuit 18. The output of the second DA converter circuit 17 is amplified by a factor of 2. The fourth amplifier circuit 20 amplifies the output of the second subtracter circuit 19 by a factor of 2. The amplified analog signal is fed back to the third amplifier circuit 18 and the second AD converter circuit 16 via the second switch SW2. The process described above is repeated so that the second AD converter circuit 16 retrieves the 8th through 9th highest bits (D3–D2) and the 10th through 11th highest bits (D1–D0). With this, an 11-bit digital value is obtained. The first through 5th highest bits (D10–D6) are obtained by a cyclic configuration in the first stage and the sixth through 11th highest bits (D5–D0) are obtained by a cyclic configuration in the subsequent stage.

Given, in the AD converter described above, that the LSB voltage of the first AD converter circuit 12 is VA, the gain of the first amplifier circuit 11 is α, the gain of the second amplifier circuit 15 is β, the LSB voltage of the second AD converter circuit 16 is VB, and the number of bits produced by the second AD converter circuit 16 by conversion is N2, the equation (A1) into which these values are substituted would be:

$$VA*\alpha*\beta = VB*2^{N2}$$

$$VA*1*4 = VB*2^2$$

$$VA = VB$$

The LSB voltage of the first AD converter circuit 12 is set to be equal to the LSB voltage of the second AD converter circuit 16.

Given that the LSB voltage of the first AD converter circuit 12 in the first cycle is VA, the LSB voltage of the first AD converter circuit 12 in the second cycle is VB, the gain of the first amplifier circuit 11 is α, the gain of the second amplifier circuit 15 is β, and the number of bits produced by conversion by the first AD converter circuit 12 in the second cycle is N2, the equation (A1) into which these values are substituted is as follows, since the LSB voltage of the first AD converter circuit 12 of this embodiment is fixed, i.e. VA=VB.

$$VA*\alpha*\beta = VB*2^{N2}$$

$$VA*1*4 = VB*2^2$$

This shows that the equation (A1) holds. The requirement here is that the product of the gain α of the first amplifier circuit 11 and the gain β of the second amplifier circuit 15 in the left side of the equation is 4. Combinations of the gains other than that described also serve the purpose. For example, a combination of 1.6 and 2.5 is possible.

Given that the LSB voltage of the second AD converter circuit 16 in a given cycle is VA, the LSB voltage of the second AD converter circuit 16 in the subsequent cycle is VB, the gain of the third amplifier circuit 18 is α, the gain of the fourth amplifier circuit 20 is β, and the number of bits produced by conversion by the second AD converter circuit 16 is N2, the equation (A1) into which these values are substituted is as follows, since the LSB voltage of the second AD converter circuit 16 of this embodiment is fixed, i.e. VA=VB.

$$VA*\alpha*\beta = VB*2^{N2}$$

$$VA*2*2 = VB*2^2$$

This shows that the equation (A1) holds. The requirement here is that the product of the gain α of the third amplifier circuit 18 and the gain β of the fourth amplifier circuit 20 in the left side of the equation is 4. Combinations of the gains other than that described also serve the purpose. For example, a combination of 1.6 and 2.5 is possible.

As demonstrated in the third embodiment, the AD converter including a plurality of AD converter circuits of a cyclic type is designed.

Fourth Embodiment

This embodiment provides a four-stage pipeline AD converter in which the AD converter circuit in the first stage converts into 4 bits and each of the AD converter circuits of the second through fourth stages converts into 2 bits, outputting a total of 10 bits.

Figure 5:
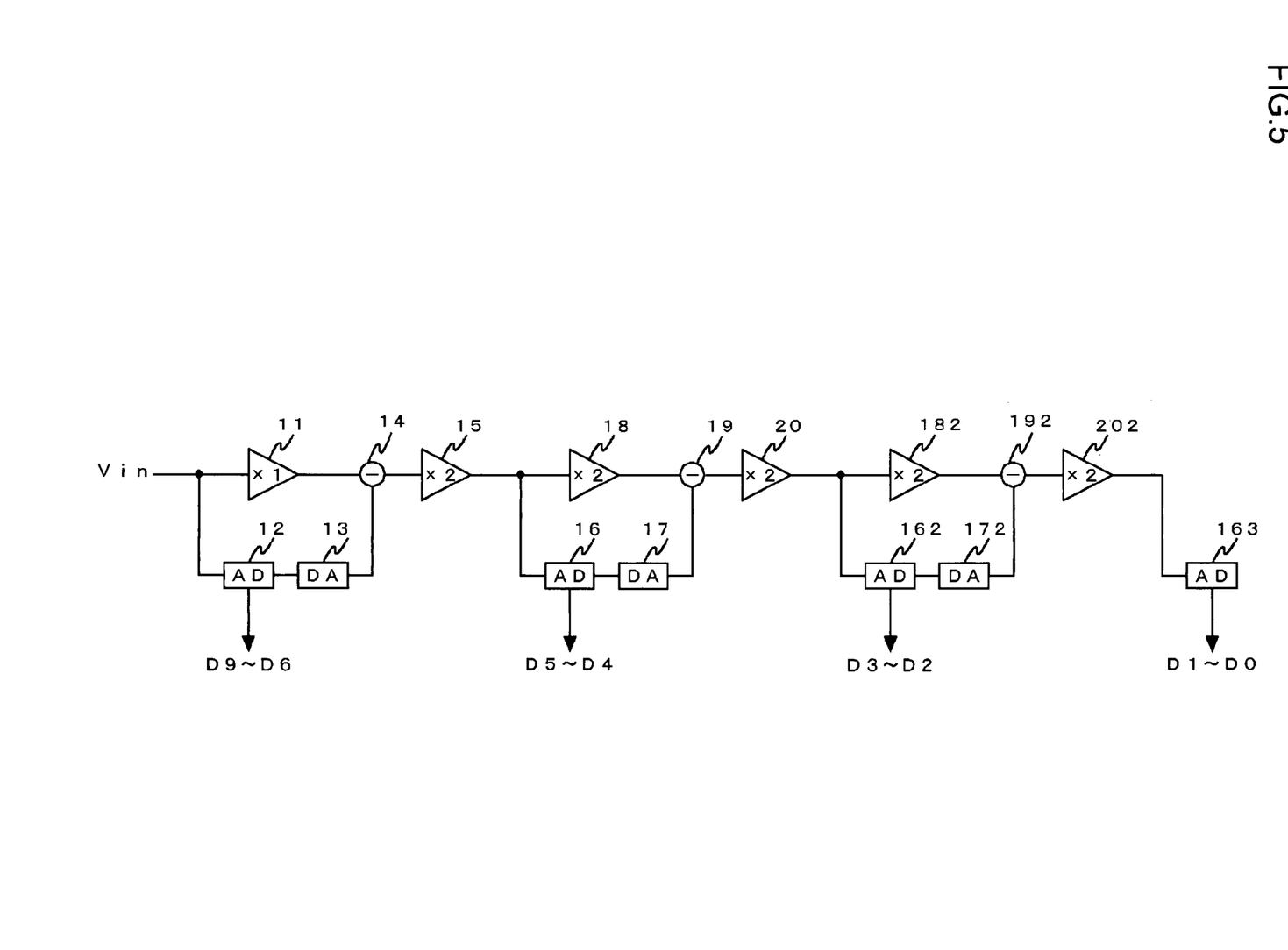
FIG. 5 illustrates the structure of an AD converter according to a fourth embodiment of the present invention.

FIG. 5 illustrates the structure of the AD converter according to the fourth embodiment. In this AD converter, the input analog signal Vin is fed to the first amplifier circuit 11 and the first AD converter circuit 12. The first AD converter circuit 12 converts the input analog signal into a digital value so as to retrieve the higher 4 bits (D9–D6). The first DA converter circuit 13 converts the digital value produced by conversion by the first AD converter circuit 12 into an analog value. The first amplifier circuit 11 samples and holds the input analog signal and outputs the signal to the first subtracter circuit 14 according to a predetermine timing schedule. The first amplifier circuit 11 does not amplify the analog signal. The first subtracter circuit 14 subtracts the output of the first DA converter circuit 13 from the output of the first amplifier circuit 11. The second amplifier circuit 15 amplifies the output of the first subtracter circuit 14 by a factor of 2.

The output of the second amplifier circuit 15 is fed to the third amplifier circuit 18 and the second AD converter circuit 16. The second AD converter circuit 16 converts the input analog signal into a digital value so as to retrieve the 5th through 6th highest bits (D5–D4). The second AD converter circuit 17 converts the digital value produced by conversion by the second AD converter circuit 16 into an analog value. The third amplifier circuit 18 amplifies the input analog signal by a factor of 2 and outputs the amplified signal to the second subtracter circuit 19. The second subtracter circuit 19 subtracts the output of the second DA converter circuit 17 from the output of the third amplifier circuit 18. The output of the second DA converter circuit 17 is amplified by a factor of 2. The fourth amplifier circuit 20 amplifies the output of the second subtracter circuit 19 by a factor of 2.

The output of the fourth amplifier circuit 20 is fed to a fifth amplifier circuit 182 and a third AD converter circuit 162. The third AD converter circuit 162 converts the input analog signal into a digital value so as to retrieve the 7th through 8th highest bits (D3–D2). A third AD converter circuit 172 converts the digital value produced by conversion by the third AD converter circuit 162 into an analog value. The fifth amplifier circuit 182 amplifies the input analog signal by a factor of 2 and outputs the amplified signal to a third subtracter circuit 192. The third subtracter circuit 192 subtracts the output of the third DA converter circuit 172 from the output of the fifth amplifier circuit 182. The output of the third DA converter circuit 172 is amplified by a factor of 2. A sixth amplifier circuit 202 amplifies the output of the third subtracter circuit 192 by a factor of 2.

The output of the sixth amplifier circuit 202 is ultimately fed to the input of a fourth AD converter circuit 163. The fourth AD converter circuit 163 converts the input analog signal into a digital value so as to retrieve the 9th through 10th highest bits (D1–D0). With this, a 10-bit digital value is obtained.

Given, in the AD converter described above, that the LSB voltage of the first AD converter circuit 12 is VA, the gain of the first amplifier circuit 11 is $\alpha$, the gain of the second amplifier circuit 15 is $\beta$, the LSB voltage of the second AD converter circuit 16 is VB, and the number of bits produced by the second AD converter circuit 16 by conversion is N2, the equation (A1) into which these values are substituted would be:

$$VA*\alpha*\beta = VB*2^{N2}$$

$$VA*1*2 = VB*2^{2}$$

$$VA = 2VB$$

This shows that the LSB voltage of the first AD converter circuit 12 should be set to a value twice the LSB voltage of the second AD converter circuit 16. Conversely, by setting the LSB voltage of the second AD converter circuit 16 to ½, the total gain of the first amplifier circuit and the second amplifier circuit 15 can be lowered to 2.

Given that the LSB voltage of the second AD converter circuit 16 is VA, the LSB voltage of the third AD converter circuit 162 is VB, the gain of the third amplifier circuit 18 is $\alpha$, the gain of the fourth amplifier circuit 20 is $\beta$, and the number of bits produced by conversion by the third AD converter circuit 162 is N2, the equation (A1) in which these values are substituted is as follows:

$$VA*\alpha*\beta = VB*2^{N2}$$

$$VA*2*2 = VB*2^{2}$$

This shows that the LSB voltage of the second AD converter circuit 16 is equal to the LSB voltage of the third AD converter circuit 162. This relation also holds when the LSB voltage of the third AD converter circuit 162 is VA, the LSB voltage of the fourth AD converter circuit 163 is VB, the gain of the fifth amplifier circuit 182 is $\alpha$, the gain of the sixth amplifier circuit 202 is $\beta$, and the number of bits produced by conversion by the fourth AD converter circuit 163 is N2.

As demonstrated in the fourth embodiment, the AD converter of a pipeline type comprising a plurality of stages is designed.

Fifth Embodiment

The fifth embodiment provides an AD converter in which, the AD converter circuit in a first stage converts into 3 bits and the AD converter circuit of a cyclic type in the subsequent stage converts into 3 bits in each cycle. By allowing the conversion in the subsequent stage to go through 3 cycles, a total of 12 bits are output. The LSB and the reference voltage of the AD converter circuit in the subsequent stage are variable.

Figure 6:
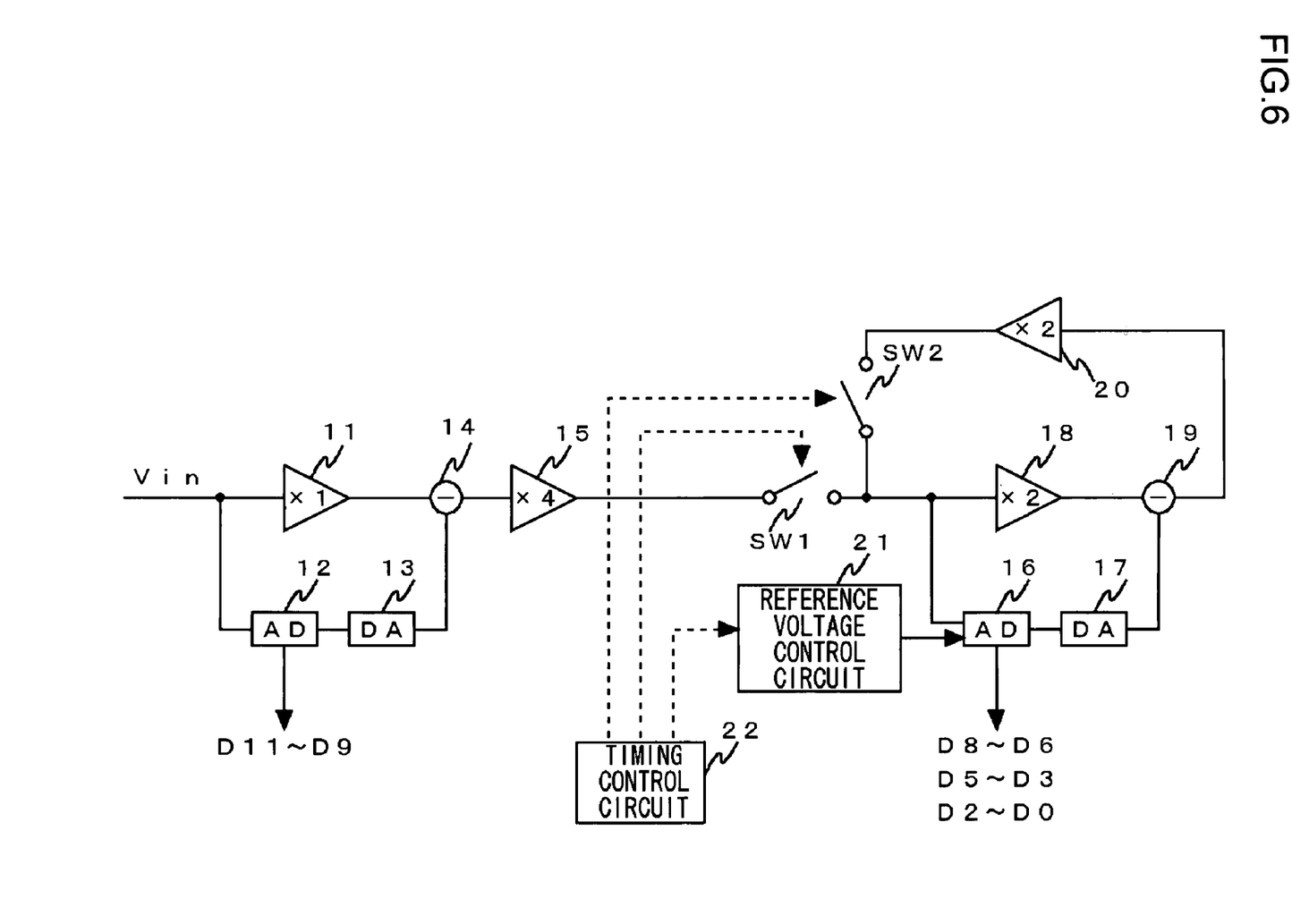
FIG. 6 illustrates the structure of an AD converter according to a fifth embodiment of the present invention.

FIG. 6 illustrates the structure of the AD converter according to the fifth embodiment. In this AD converter, the input analog signal Vin is fed to the first amplifier circuit 11 and the first AD converter circuit 12. The first AD converter circuit 12 converts the input analog signal into a digital value so as to retrieve the higher 3 bits (D11–D9). The first DA converter circuit 13 converts the digital value produced by conversion by the first AD converter circuit 12 into an analog value. The first amplifier circuit 11 samples and holds the input analog signal and outputs the signal to the first subtracter circuit 14 according to a predetermine timing schedule. The first amplifier circuit 11 does not amplify the analog signal. The first subtracter circuit 14 subtracts the output of the first DA converter circuit 13 from the output of the first amplifier circuit 11. The second amplifier circuit 15 amplifies the output of the first subtracter circuit 14 by a factor of 4.

The output of the second amplifier circuit 15 is fed to the third amplifier circuit 18 and the second AD converter circuit 16 via the first switch SW1. The second AD converter circuit 16 converts the input analog signal into a digital value so as to retrieve the 4th through 6th highest bits (D8–D6). A reference voltage control circuit 21 controls the reference voltage range of the second AD converter circuit 16 in a given cycle to ½ of the level of the previous cycle. With this, the LSB and the reference voltage of the second AD converter circuit 16 in a given cycle continue to be dropped to ½ of the levels of the previous cycle.

The second DA converter circuit 17 converts the digital value produced by conversion by the second AD converter circuit 16 into an analog value. The third amplifier circuit 18 amplifies the input analog signal by a factor of 2 and outputs the amplified signal to the second subtracter circuit 19. The second subtracter circuit 19 subtracts the output of the second DA converter circuit 17 from the output of the third amplifier circuit 18. The output of the second DA converter circuit 17 is amplified by a factor of 2. The fourth amplifier circuit 20 amplifies the output of the second subtracter circuit 19 by a factor of 2. The amplified analog signal is fed back to the third amplifier circuit 18 and the second AD converter circuit 16 via the second switch SW2. A timing control circuit 22 subjects the first switch SW1 and the second switch SW2 to on/off control. Further, the timing control circuit 22 feeds a timing signal cycle by cycle to the reference voltage control circuit 21.

The process described above is repeated so that the second AD converter circuit 16 retrieves the 7th through 9th highest bits (D5–D3) and the 10th through 12th highest bits (D2–D0). With this, a 12-bit digital value is obtained. The 4th through 12th highest bits (D8–D0) are obtained by a cyclic configuration. Given that the reference voltage of the second AD converter circuit 16 is 1 when it retrieves the 4th through 6th bits (D8–D6) in the first cycle, the reference voltage drops to ½ when it retrieves the 7th through 9th bits (D5–D3) in the second cycle and further drops to ½ of the level of the second cycle when it retrieves the 10th through 12bth bits (D2–D0) in the third cycle. In other words, the reference voltage in the third cycle is dropped to ¼ of the level of the first cycle.

Given that, in the AD converter described above, that the LSB voltage of the first AD converter circuit 12 is VA, the gain of the first amplifier circuit 11 is $\alpha$, the gain of the second amplifier circuit 15 is $\beta$, the LSB voltage of the second AD converter circuit 16 is VB, and the number of bits produced by the second AD converter circuit 16 by conversion is N2, the equation (A1) into which these values are substituted would be:

$$VA*\alpha*\beta = VB*2^{N2}$$

$$VA*1*4 = VB*2^3$$

$$VA = 2VB$$

The LSB voltage of the first AD converter circuit 12 should be set to be twice the LSB voltage of the second AD converter circuit 16. Conversely, by setting the LSB voltage of the second AD converter circuit 12 to ½, the total gain of the first amplifier circuit 11 and the second amplifier circuit 15 can be lowered to 4.

Given that the LSB voltage of the second AD converter circuit 16 in the first cycle is VA, the LSB voltage of the second AD converter circuit 16 in the second cycle is VB, the gain of the third amplifier circuit 18 is $\alpha$, the gain of the fourth amplifier circuit 20 is $\beta$, and the number of bits produced by conversion by the second AD converter circuit 16 is N2, the equation (A1) in which these values are substituted is as follows, since the LSB voltage of the second AD converter circuit 16 of this embodiment is dropped to ½ in the second cycle.

$$VA*\alpha*\beta = VB*2^{N2}$$

$$1*2*2 = ½*2^3$$

This shows that the equation (A1) holds. The requirement here is that the product of the gain $\alpha$ of the third amplifier circuit 18 and the gain $\beta$ of the fourth amplifier circuit 20 in the left side of the equation is 4. Combinations of the gains other than that described also serve the purpose. For example, a combination of 1.6 and 2.5 is possible.

Given that the LSB voltage of the second AD converter circuit 16 in the second cycle is VA, the LSB voltage of the second AD converter circuit 16 in the third cycle is VB, the gain of the third amplifier circuit 18 is $\alpha$, the gain of the fourth amplifier circuit 20 is $\beta$, and the number of bits produced by conversion by the second AD converter circuit 16 is N2, the equation (A1) in which these values are substituted is as follows, since the LSB voltage of the second AD converter circuit 16 of this embodiment is further dropped to ½ in the third cycle.

$$VA*\alpha*\beta = VB*2^{N2}$$

$$1/2*2*2 = ¼*2^3$$

This shows that the equation (A1) holds.

Thus, according to the fifth embodiment, by progressively lowering the LSB voltage of the second AD converter circuit 16 as the circuit proceeds through cycles, the total gain of the third amplifier circuit 18 and the fourth amplifier circuit 20 can be lowered. Accordingly, the operation speed is improved so that the operation speed of the AD converter as a whole is improved.

Described above is an explanation of the present invention based on the embodiments. The description of the embodiment sis illustrative in nature and various variations in constituting elements and processes involved are possible. Those skilled in the art would readily appreciate that the variations are also within the scope of the present invention.

Parameters such as the number of bits produced as a result of conversion, allocation of conversion bits, the gain of the amplifier circuits, the LSB voltage and the reference voltage given in the description above of the embodiments are merely by way of examples. Other parameter values may also be employed in the variations.

What is claimed is:

1. An analog-digital conversion method which converts an analog signal into a digital value of a predetermined number of bits, in a plurality of sequential steps starting from higher bits, comprising:

a first conversion step of comparing a predetermined reference voltage value with a reference voltage value generated by a first least significant bit voltage value and converting an analog signal into at least 1 bit;

and a second conversion step of comparing a predetermined reference voltage value with a reference voltage value generated by a second least significant bit voltage value and converting an analog signal, having a bit component produced by conversion in said first conversion step removed therefrom and amplified by a predetermined gain, into at least 1 bit lower in the order than the bits produced by conversion in said first conversion step, wherein a value obtained by multiplying said first least significant bit voltage value by said predetermined gain is practically equal to a value obtained by multiplying said second least significant bit voltage value by a value obtained by raising 2 to the power of the number of bits produced by conversion in said second conversion step and having redundant bits excluded therefrom, and wherein said first least significant bit voltage value differs from said second least significant bit voltage value.

2. The analog-digital conversion method according to claim 1, wherein said second least significant bit voltage value is smaller than said first least significant bit voltage value.

3. An analog-digital converter comprising:

a first analog-digital converter circuit converting an input analog signal into a digital value of a predetermined number of bits;

a digital-analog converter circuit converting an output of said first analog-digital converter circuit into an analog signal;

a subtracter circuit subtracting an output of said digital-analog converter circuit from said input analog signal;

an amplifier circuit amplifying an output of said subtracting circuit by a predetermined gain; and a second analog-digital converter circuit converting an output analog signal from said amplifier circuit into a digital value of a predetermined number of bits, wherein a value obtained by multiplying a least significant bit voltage value of said first analog-digital converter circuit by the gain of said amplifier circuit is practically equal to a value obtained by multiplying a least significant bit voltage value of said second analog-digital converter circuit by a value obtained by raising 2 to the power of the number of bits produced by conversion in said second analog-digital converter circuit and having redundant bits excluded therefrom, and wherein the least significant bit voltage value of said first analog-digital converter circuit differs from the least significant bit voltage value of said second analog-digital converter circuit.

4. The analog-digital converter according to claim 3, wherein the least significant bit voltage value of said second analog-digital converter circuit is smaller than the least significant bit voltage value of said first analog-digital converter circuit.

5. An analog-digital converter comprising:

a first analog-digital converter circuit converting an input analog signal into a digital value of a predetermined number of bits;

a digital-analog converter circuit converting an output of said first analog-digital converter circuit into an analog signal;

a first amplifier circuit provided parallel with said first analog-digital converter circuit and amplifying said input analog signal by a predetermined gain;

a subtracter circuit subtracting an output of said digital-analog converter circuit amplified by practically the same gain as the gain of said first amplifier circuit from an output of said first amplifier circuit;

a second amplifier circuit amplifying an output of said subtracting circuit by a predetermined gain;

a second analog-digital converter circuit converting an output analog signal from said second amplifier circuit into a digital value of a predetermined number of bits, wherein a value obtained by multiplying a least significant bit voltage value of said first analog-digital converter circuit by the gain of said amplifier circuit and said gain of the second amplifier circuit is practically equal to a value obtained by multiplying a least significant bit voltage value of said second analog-digital converter circuit by a value obtained by raising 2 to the power of the number of bits produced by conversion in said second analog-digital converter circuit and having redundant bits excluded therefrom, and wherein the least significant bit voltage value of said first analog-digital converter circuit differs from the least significant bit voltage value of said second analog-digital converter circuit.

6. The analog-digital converter according to claim 5, wherein the least significant bit voltage value of said second analog-digital converter circuit is smaller than the least significant bit voltage value of said first analog-digital converter circuit.

7. The analog-digital converter according to claim 6, wherein the gain of said first amplifier circuit and the gain of said second amplifier circuit are related to each other such that one is equal to or more than ½ of the other and equal to or less than twice the other.

8. The analog-digital converter according to claim 6, wherein the gain of said first amplifier circuit is smaller than the gain of said second amplifier circuit.

9. The analog-digital converter according to claim 6, wherein said first amplifier circuit samples and holds said input analog signal and outputs the signal to said subtracter circuit according to a predetermined timing schedule.

10. The analog-digital converter according to claim 5, wherein the gain of said first amplifier circuit and the gain of said second amplifier circuit are related to each other such that one is equal to or more than ½ of the other and equal to or less than twice the other.

11. The analog-digital converter according to claim 5, wherein the gain of said first amplifier circuit is smaller than the gain of said second amplifier circuit.

12. The analog-digital converter according to claim 5, wherein said first amplifier circuit samples and holds said input analog signal and outputs the signal to said subtracter circuit according to a predetermined timing schedule.

13. An analog-digital converter comprising:

an analog-digital converter circuit converting an input analog signal into a digital value of a predetermined number of bits;

a digital-analog converter circuit converting an output of said analog-digital converter circuit into an analog signal;

a first amplifier circuit provided parallel with said analog-digital converter circuit and amplifying said input analog signal by a predetermined gain;

a subtracter circuit subtracting an output of the said digital-analog converter circuit amplified by practically the same gain as the gain of said first amplifier circuit from an output of said first amplifier circuit;

a second amplifier circuit amplifying an output of said subtracting circuit by a predetermined gain and feeding the amplified output back to the input of said analog-digital converter circuit; wherein a digital value in excess of said predetermined number of bits is obtained by allowing said input analog signal through a plurality of cycles such that a value obtained by multiplying a least significant bit voltage value of said analog-digital converter circuit in a given cycle by the gain of said first amplifier circuit and the gain of said second amplifier circuit is practically equal to a value obtained by multiplying a least significant bit voltage value of said analog-digital converter circuit in a subsequent cycle by a value obtained by raising 2 to the power of the number of bits produced by conversion in said analog-digital converter circuit and having redundant bits excluded therefrom, and wherein the least significant bit voltage value of said analog-digital converter circuit in said given cycle differs from the least significant bit voltage value of said analog-digital converter circuit in said subsequent cycle.

14. The analog-digital converter according to claim 13, wherein the least significant bit voltage value in said subsequent cycle is smaller than the least significant bit voltage value of said given cycle.

15. The analog-digital converter according to claim 14, wherein the gain of said first amplifier circuit and the gain of said second amplifier circuit are related to each other such that one is equal to or more than ½ of the other and equal to or less than twice the other.

16. The analog-digital converter according to claim 14, wherein the gain of said first amplifier circuit is smaller than the gain of said second amplifier circuit.

17. The analog-digital converter according to claim 14, wherein said first amplifier circuit samples and holds said input analog signal and outputs the signal to said subtracter circuit according to a predetermined timing schedule.

18. The analog-digital converter according to claim 13, wherein the gain of said first amplifier circuit and the gain of said second amplifier circuit are related to each other such that one is equal to or more than ½ of the other and equal to or less than twice the other.

19. The analog-digital converter according to claim 13, wherein the gain of said first amplifier circuit is smaller than the gain of said second amplifier circuit.

20. The analog-digital converter according to claim 13, wherein said first amplifier circuit samples and holds said input analog signal and outputs the signal to said subtracter circuit according to a predetermined timing schedule.

* * * * *